(12) United States Patent
Jeong et al.

(10) Patent No.: US 10,529,421 B2
(45) Date of Patent: Jan. 7, 2020

(54) MEMORY SYSTEM HAVING RESISTIVE MEMORY DEVICE FOR SCHEDULING WRITE COMMAND AND OPERATING METHOD THEREOF

(71) Applicant: SK hynix Inc., Gyeonggi-do (KR)

(72) Inventors: Seung-Gyu Jeong, Gyeonggi-do (KR); Jung-Hyun Kwon, Seoul (KR); Do-Sun Hong, Gyeonggi-do (KR); Won-Gyu Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/007,659

(22) Filed: Jun. 13, 2018

(65) Prior Publication Data

US 2019/0164605 A1    May 30, 2019

(30) Foreign Application Priority Data

Nov. 28, 2017    (KR) .................... 10-2017-0160652

(51) Int. Cl.
  *G11C 11/00*    (2006.01)
  *G11C 13/00*    (2006.01)
  *G06F 1/28*    (2006.01)
  *G06F 13/10*    (2006.01)
(52) U.S. Cl.
  CPC ............ *G11C 13/0069* (2013.01); *G06F 1/28* (2013.01); *G06F 13/102* (2013.01); *G11C 13/004* (2013.01); *G11C 13/0004* (2013.01)

(58) Field of Classification Search
  CPC .............. G11C 13/0069; G11C 13/004; G11C 13/0004; G06F 13/102; G06F 1/28
  USPC ......................................................... 365/163
  See application file for complete search history.

(56) References Cited

U.S. PATENT DOCUMENTS

| 9,612,958 B1* | 4/2017 | Asnaashari ........ G11C 13/0069 |
| 2013/0311717 A1* | 11/2013 | Kim .................... G06F 12/0246 |
| | | 711/104 |
| 2014/0211556 A1 | 7/2014 | Li et al. |

FOREIGN PATENT DOCUMENTS

KR    1020100061306    6/2010

* cited by examiner

*Primary Examiner* — Tha-O H Bui
(74) *Attorney, Agent, or Firm* — IP & T Group LLP

(57) ABSTRACT

A memory system includes a memory cell array including a plurality of resistive memory cells; a peripheral circuit suitable for providing a set pulse or a reset pulse with write data into a selected memory cell among the resistive memory cells, based on a write command; and a memory controller suitable for providing the write command with the write data to the peripheral circuit and scheduling the write command based on an amount of power consumption calculated depending on the number of either low bits or high bits in the write data.

24 Claims, 13 Drawing Sheets

FIG. 8

| | CASE 1 | CASE 2 | CASE 3 |
|---|---|---|---|
| RDATA_PRE | 1111 0000 | 1111 0000 | 0011 0011 |
| WDATA | 1100 1111 | 1111 0011 | 1100 1111 |
| MSK_DATA | 0011 1111 | 0000 0011 | 1111 1100 |
| CDBI | '0' | '1' | '0' |
| /WDATA | 0011 0000 | - | 0011 0000 |
| /MSK_DATA | 1100 0000 | - | 0000 0011 |
| BIT_NUM | 0'S → 2 | 1'S → 2 | 0'S → 2 |

US 10,529,421 B2

MEMORY SYSTEM HAVING RESISTIVE MEMORY DEVICE FOR SCHEDULING WRITE COMMAND AND OPERATING METHOD THEREOF

CROSS-REFERENCE TO RELATED APPLICATIONS

This application claims priority under 35 U.S.C. § 119 to Korean Patent Application No. 10-2017-0160652, filed on Nov. 28, 2017, the disclosure of which is incorporated herein by reference in its entirety.

BACKGROUND

1. Field

Various embodiments of the present invention relate to a semiconductor design technique, and more particularly, to a command scheduling method of a memory system having a resistive memory device.

2. Description of the Related Art

Regarding the demands for high capacity and low-power consumption of semiconductor memory devices, research on next-generation memory devices having non-volatility and not having a refresh have been conducted. The next-generation memory devices include a phase-change random access memory (PRAM) using a phase-change material, a resistive random access memory (RRAM) using a variable resistance material such as a transition metal oxide, and a magnetic random access memory (MRAM) using a ferromagnetic material. The resistance of materials consisting of next-generation semiconductor memory elements may be varied in accordance with a voltage or a current supplied into memory devices. Even though the current or voltage supply is interrupted, not only do the materials retain the resistance but a high operating speed is also secured.

Particularly, among such resistive memory devices, a PRAM is applicable to various semiconductor systems and diverse semiconductor memory devices because its data is non-volatile and can be accessed at random.

SUMMARY

Various embodiments of the disclosure are directed to a memory system that may schedule a write command applied to a resistive memory device based on the number of bits having a logical high data or logical low data in write data, and an operating method of the memory system.

In accordance with an embodiment of the present invention, a memory system includes: a memory cell array including a plurality of resistive memory cells; a peripheral circuit suitable for providing a set pulse or a reset pulse with write data into a selected memory cell among the resistive memory cells, based on a write command; and a memory controller suitable for providing the write command with the write data to the peripheral circuit and scheduling the write command based on an amount of power consumption calculated depending on the number of either low bits or high bits in the write data.

In accordance with an embodiment of the present invention, an operating method of a memory system includes: generating a write command and a write data; calculating an amount of power consumption depending on the number of low bits or high bits in the write data and issuing the write command with the write data to a memory device based on a value obtained by cumulatively adding up the calculated amount of power consumption; and providing, by the memory device, a set pulse or a reset pulse corresponding to the write data to a selected memory cell among resistive memory cells based on the write command.

In accordance with an embodiment of the present invention, an operating method of a memory system includes: generating a write command and write data; calculating an amount of power consumption depending on a number of low bits or high bits in the write data; storing the calculated amount of power consumption in a power data table based on an address when the write command commands a first write operation; cumulatively adding up the amount of power consumption stored in the power data table based on the address when the write command commands a second write operation; issuing the write command and the write data to a memory device based on a value obtained by cumulatively adding up the amount of power consumption; and providing, by the memory device, a set pulse or a reset pulse corresponding to the write data to a selected memory cell among resistive memory cells based on the write command.

BRIEF DESCRIPTION OF THE DRAWINGS

FIG. 8 is a table for describing an operation of a memory controller shown in FIG. 7.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
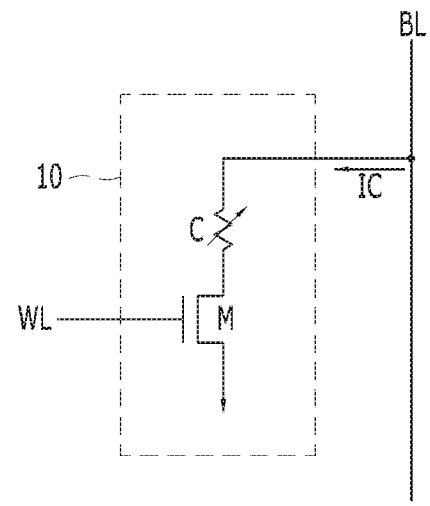
FIG. 1 is a diagram illustrating a memory cell of a resistive memory device.

FIG. 1 is a diagram illustrating a memory cell 10 of a resistive memory device.

Referring to FIG. 1, the memory cell 10 of the resistive memory device may include a variable resistor C and an access transistor M.

The variable resistor C may be coupled to a bit line BL, while a gate of the access transistor M may be coupled to a word line. The access transistor M may be arranged between the variable resistor C and a ground. In response to a voltage supplied to the word line WL, the access transistor M may be turned on or off. A current IC delivered from the bit line BL may flow through the variable resistor C.

In a case where the variable resistor C includes a phase-change material such as a chalcogenide alloy in a crystalline state or an amorphous state determined according to the change of temperature, the resistive memory device may be constituted with a phase-change memory device. A method using a laser beam and a method using a current are widely known as methods for heating a phase-change material. However, the method using the current is preferred because implementation of a memory chip may be easier. Accordingly, the phase-change memory device may utilize the phase-change material of which state is changed from the crystalline state to the amorphous state, or vice versa, according to the current IC supplied through the bit line BL in order to write data.

Figure 2:
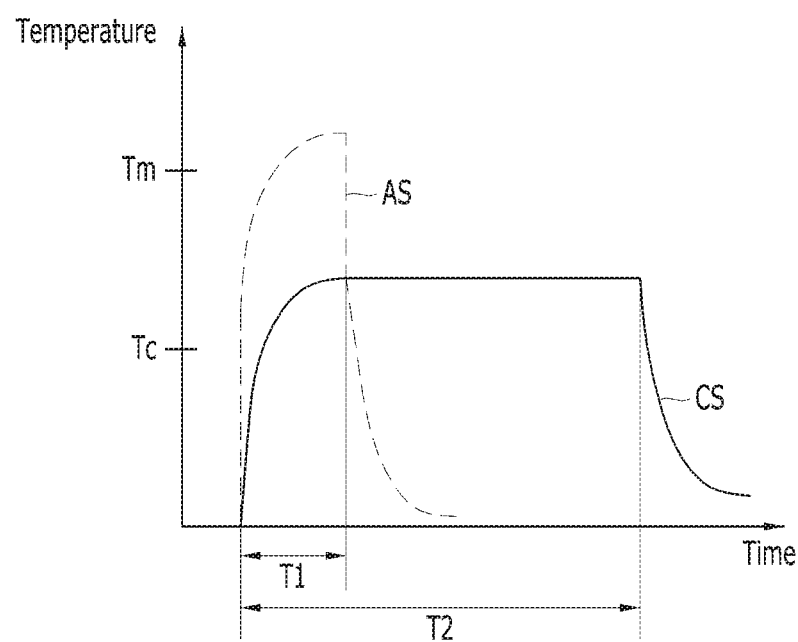
FIG. 2 is a graph for describing characteristics of a phase-change material of a memory cell of a resistive memory device.

FIG. 2 is a graph for describing characteristics of a phase-change material of the memory cell 10 of the resistive memory device.

In FIG. 2, the reference symbol AS (hereinafter, referred to as a reset pulse AS) may show a condition for causing the phase-change material to get into an amorphous state, while the reference symbol CS (hereinafter, referred to as a set pulse CS) may be considered a condition for causing the phase-change material to get into a crystalline state.

Referring to FIG. 2, the phase-change material is heated up to a higher temperature than a melting temperature Tm, in response to the reset pulse AS supplied through the bit line, and then rapidly quenched during a first time T1 after being heated up, thereby getting into the amorphous state. The amorphous state may be referred to as a reset state. It is deemed that a logical high data "1" may be stored in the phase-change material in the amorphous state, i.e., the reset state.

Otherwise, the phase-change material is heated up to a temperature that is higher than a crystallization temperature Tc and is lower than the melting temperature Tm, in response to the set pulse CS supplied through the bit lines, and then slowly quenched during a second time T2, longer than the first time T1 (T2>T1), after being heated up, thereby getting into the crystalline state. The crystalline state is referred to as a set state. It is considered that a logical low data "0" may be stored in the phase-change material in the crystalline state, i.e., the set state. A resistance of the memory cell is varied with an amorphous volume of the phase-change material. The resistance of the memory cell may be the highest in the amorphous state but the lowest in the crystalline state.

A basic operation of the phase-change memory device is described below with reference to FIGS. 1 and 2.

In a write operation of the phase-change memory device, when a voltage is applied to the word line WL, the access transistor M is turned on so that the current IC is supplied to the variable resistor C, i.e., the phase-change material, through the bit line BL. Accordingly, based on the current IC, the variable resistor C can get into the crystalline state or the amorphous state.

The write operation includes a reset operation for converting a state of the phase-change material into the reset state based on the reset pulse AS to write the logical high data "1" and a set operation for converting the state of the phase-change material into the set state based on the set pulse CS to write the logical low data "0". Since the resistance of the phase-change material in the amorphous state is relatively higher than in the crystalline state, the reset pulse AS for the reset operation has a greater peak current than the set pulse CS for the set operation. The set pulse CS for the set operation is applied for a longer time than the reset pulse AS for the reset operation, thereby causing larger current consumption.

In a read operation of the phase-change memory device, when a voltage is applied to the word line WL, the access transistor M is turned on so that a read pulse is supplied to the variable resistor C, i.e., the phase-change material, through the bit line BL. In this case, a state of the phase-change material, that is, data stored in the phase-change material, may be determined based on the amount of current depending on the resistance of the phase-change material.

Generally, the write operation of the phase-change memory device may require plenty of current to change the state of the phase-change material, and latency of the write operation may be long. Further, the read operation of the phase-change memory device may read values of data by using a small amount of current because it senses just a present state of the phase-change material, and latency of the read operation may be short.

Meanwhile, the phase-change memory device has been developed to be a non-volatile memory having the property of retaining data when electrical power fails or is turned off. However, data may evanesce due to a drift phenomenon in which the resistance varies as time passes after the data is written in the memory cell. Accordingly, the resistive memory device may be required to secure a time until a resistance level of a memory cell reaches a target level, i.e., a data recovery time, after writing data in the memory cell. According to the data recovery time, the number of write commands delivered from a controller into the phase-change memory device during the write operation may be restricted.

In addition, the controller may schedule commands so that a value obtained by adding a constant figure does not exceed an allocated power budget whenever the commands are generated during the write operation and/or the read operation in the phase-change memory device. The constant figure may be set in consideration of the worst power condition capable of being consumed when a corresponding command is executed. Even though the data recovery time is satisfied, the number of the write commands delivered from the controller to the phase-change memory device may be restricted for a predetermined period according to the allocated power budget.

As described above, in the write operation of the phase-change memory device, a time when a pulse is supplied and the amount of current consumed during the reset operation are different from those during the set operation. That is, a power consumed when a logical high data is written may be different from a power consumed when a logical low data is written. However, this is not considered in a current memory system, which leads to performance degradation of the write operation.

Hereinafter, in examples of the disclosure, a method for calculating a power consumed depending on the number of low bits or high bits in the write data during the write operation and efficiently performing the write operation based on the calculated amount of power consumption will be described.

In the embodiments of the disclosure, in a specific data, a high bit may be defined as a bit having a logical value of "1", while a low bit may be defined as a bit having a logical value of "0". Also, a major bit may be defined as a bit which takes the most number of bits included in the specific data. By way of example but not limitation, when there is 11-bit data '01100000001', the number of the low bits in the specific data may be 8, and the number of the high bits in the specific data may be 3. In this case, the major bit of the data may become the low bit.

Figure 3:
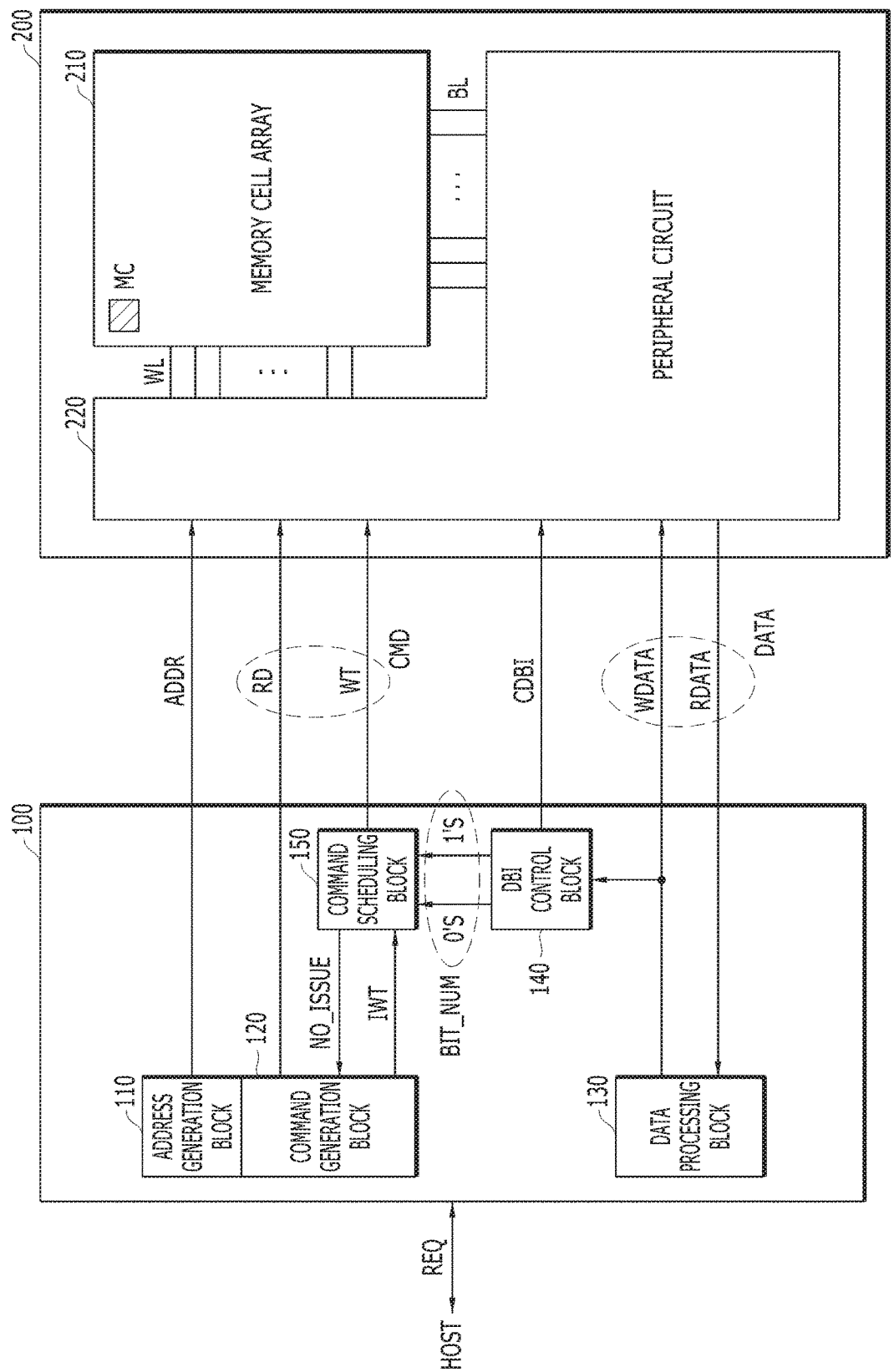
FIG. 3 is a block diagram illustrating a memory system in accordance with an embodiment of the present invention.

FIG. 3 is a block diagram illustrating a memory system in accordance with an embodiment of the disclosure.

Referring to FIG. 3, the memory system may include a memory controller 100 and a memory device 200.

The memory device 200 may include a memory cell array 210 and a peripheral circuit 220. The memory cell array 210 may include a plurality of memory cells MC. The peripheral circuit 220 may be coupled to the memory cells MC through a plurality of word lines WL and a plurality of bit lines BL. The memory cells MC of the memory cell array 210 may be resistive memory cells, which are described above with reference to FIGS. 1 and 2, and the memory device 200 may include a phase-change random access memory (PCRAM). The peripheral circuit 220 may provide a set pulse or a reset pulse, which corresponds to write data WDATA, to a memory cell (hereinafter, referred to as a "target memory cell") selected according to an address ADDR among the resistive memory cells based on a write command WT. A write operation may include a reset operation for writing a high bit "1" of the write data WDATA based on the reset pulse and a set operation for writing a low bit "0" of the write data WDATA based on the set pulse.

The memory controller 100 may transmit a command CMD, a data DATA and an address ADDR to the memory device 200 to control an operation of the memory device 200 in response to a request REQ inputted from a host.

By way of example but not limitation, when the request REQ received from the host is a write request, the controller 100 may transmit a write command WT, a write data WDATA and an address ADDR corresponding to at least one target memory cell of the memory cell array 210 into the memory device 200 to control the write operation so that the write data WDATA is programmed in the at least one target memory cell. When the request REQ inputted from the host is a read request, the controller 100 may transmit a read command RD and an address ADDR corresponding to at least one target memory cell of the memory cell array 210 into the memory device 200 to control a read operation so that read data RDATA is read out from the at least one target memory cell.

Particularly, the memory controller 100 may schedule the write command WT based on power consumption calculated depending on the number of low bits or high bits, of the write data WDATA.

More specifically, the memory controller 100 may include an address generation block 110, a command generation block 120, a data processing block 130, a data bus inversion (DBI) control block 140, and a command scheduling block 150.

The address generation block 110 may generate an address ADDR when the request REQ is inputted from the host. The address ADDR may include a row address for designating a word line WL and a column address for designating a bit line BL. When the memory cell array 210 includes a plurality of banks, the address ADDR may further include a bank address for designating at least one bank.

The command generation block 120 may generate the command CMD when the request REQ is inputted from the host. The command CMD may include the write command WT commanding the write operation and the read command RD commanding the read operation. By way of example but not limitation, the command generation block 120 may generate commands for various operations.

The data processing block 130 may generate the write data WDATA when the request REQ inputted from the host is the write request, and transmit the read data RDATA, which is provided from the memory device 200 when the request REQ inputted from the host is the read request, to the host.

The DBI control block 140 may count the number of the low bits or the high bits of the write data WDATA and determine DBI information CDBI corresponding to the write data WDATA based on a counting result. By way of example but not limitation, when the low bit is the major bit of the write data WDATA, the DBI control block 140 may determine the DBI information CDBI as "0". When the high bit is the major bit of the write data WDATA, the DBI control block 140 may determine the DBI information CDBI as "1". In an embodiment, when the low bit is the major bit of the write data WDATA, the DBI control block 140 may determine the DBI information CDBI as "1", and when the high bit is the major bit of the write data WDATA, the DBI control block 140 may determine the DBI information CDBI as "0". The DBI information may be used as reference information for inverting the bits of the write data WDATA when the memory device 200 programs the write data WDATA transmitted from the controller 100. Meanwhile, although it is described in FIG. 3 that the DBI information CDBI and the write data WDATA are provided as separate signals to the memory device 200, the disclosure is not limited to this. In an embodiment, the write data WDATA in which the DBI information CDBI is reflected, that is, which is inverted or non-inverted based on the DBI information CDBI, may be provided without transmission of the DBI information CDBI to the memory device 200.

For example, the DBI control block 140 may count the low bit or the high bit of the write data WDATA based on the DBI information CDBI to provide bit count information BIT_NUM to the command scheduling block 150. The bit count information BIT_NUM may include low bit information 0'S and high bit information 1'S. In an embodiment, the bit count information BIT_NUM may include at least one of the low bit information 0'S and the high bit information 1'S.

The DBI control block 140 may count a specific bit of the write data WDATA to be written in the memory cell array 210 based on the DBI information CDBI. By way of example but not limitation, if the memory device 200 inverts the bits of the write data WDATA when the DBI information CDBI is "1", the DBI control block 140 may count the low bit of the write data WDATA to provide the counted low bit as the low bit information 0'S of the bit count information BIT_NUM to the command scheduling block 150, and may count the high bit of the write data WDATA to provide the counted high bit as the high bit information 1'S of the bit count information BIT_NUM to the command scheduling block 150. If the memory device 200 inverts the bits of the write data WDATA when the DBI information CDBI is "0", the DBI control block 140 may count the high bit of the write data WDATA and provide the counted high bit as the low bit information 0'S of the bit count information BIT_NUM to the command scheduling block 150, and may count the low bit of the write data WDATA and provide the counted low bit as the high bit information 1'S of the bit count information BIT_NUM to the command scheduling block 150. However, the disclosure is not limited thereto. In an embodiment, the DBI control block 140 may count at least one of the high bit or the low bit of the write data WDATA and provide the bit count information BIT_NUM to the command scheduling block 150.

The command scheduling block 150 may calculate the amount of power consumption depending on the bit count information BIT_NUM and adjust the number of the write commands WT applied to the memory device 200 for a predetermined period based on a value obtained by cumulatively adding up the calculated amount of power consumption. The command scheduling block 150 may generate an internal write command IWT, generated from the command generation block 120, serving as the write command WT of the memory device 200 when the value, obtained by cumulatively adding up the calculated amount of power consumption, is smaller than the allocated power budget. The command scheduling block 150 may not deliver the internal write command IWT generated from the command generation block 120 to the memory device 200 and output an issue suspension signal NO_ISSUE when the value is equal to or greater than the allocated power budget.

The command generation block 120 may suspend generation of additional write commands in response to the issue suspension signal NO_ISSUE. Meanwhile, it is described in FIG. 3 that the address generation block 110, the command generation block 120 and the data processing block 130 are separate components, but, in an embodiment, they may be implemented to be included in a single component or circuit.

Figure 4:
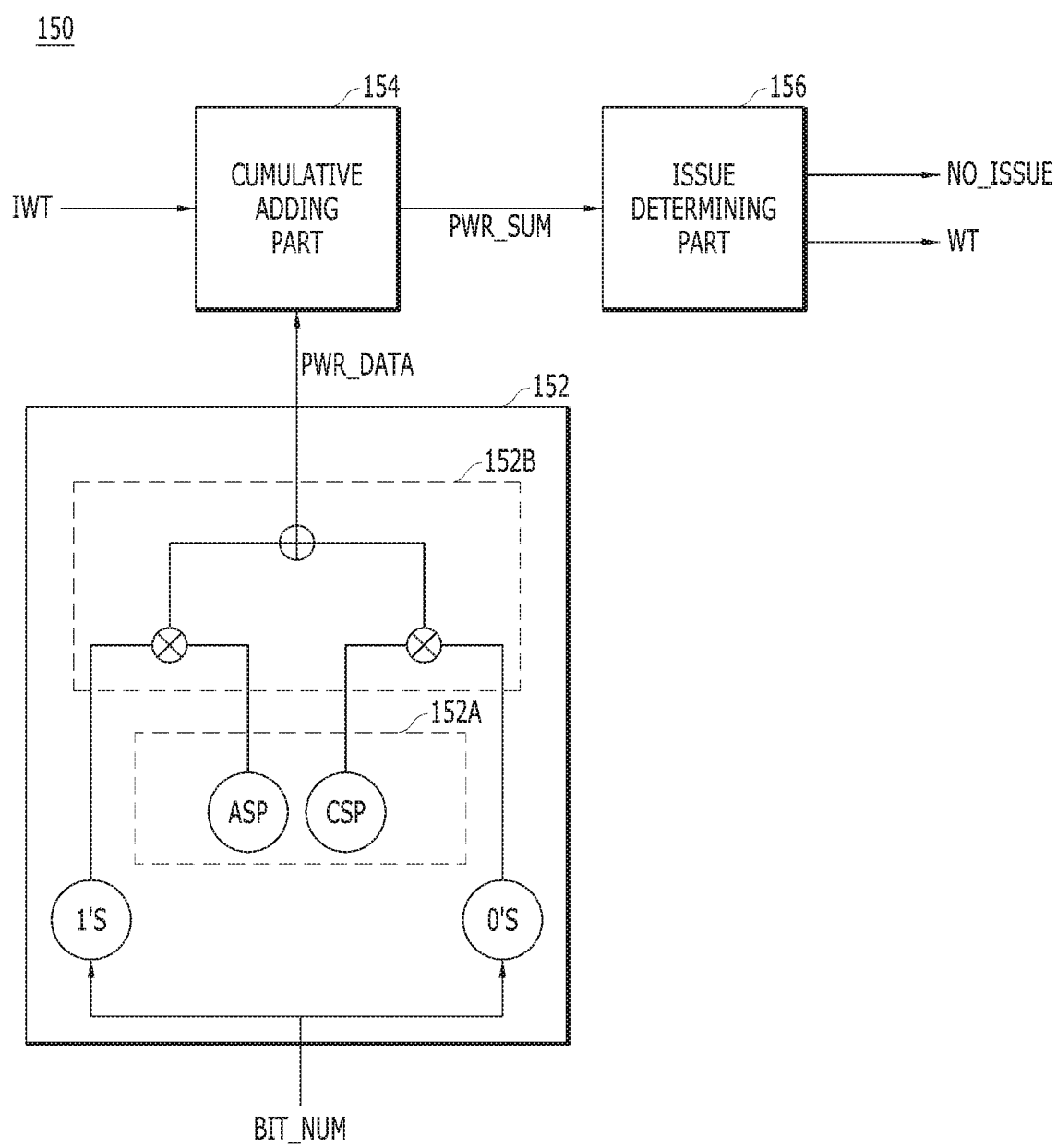
FIG. 4 is a block diagram illustrating a command scheduling block shown in FIG. 3.

FIG. 4 is a block diagram illustrating the command scheduling block 150 shown in FIG. 3.

Referring to FIG. 4, the command scheduling block 150 may include a power calculation part 152, a cumulative adding part 154, and an issue determining part 156.

The power calculation part 152 may calculate the amount of power consumption depending on the bit count information BIT_NUM to generate power data PWR_DATA.

More specifically, the power calculation part 152 may include a power set unit 152A and an arithmetic operation unit 152B. The power set unit 152A may determine a first power amount ASP required for applying the reset pulse and a second power amount CSP required for applying the set pulse. The arithmetic operation unit 152B may multiply the high bit information 1'S included in the bit count information BIT_NUM by the first power amount ASP, multiply the low bit information 0'S included in the bit count information BIT_NUM by the second power amount CSP, and add up values obtained by the multiplication, thereby outputting the power data PWR_DATA.

The cumulative adding part 154 may cumulatively add up the power data PWR_DATA to output a cumulative adding signal PWR_SUM in response to the internal write command IWT. That is, the cumulative adding part 154 may cumulatively add up the power data PWR_DATA calculated whenever the internal write command IWT is inputted, thereby outputting the cumulative adding signal PWR_SUM.

The issue determining part 156 may determine whether or not to issue the internal write command IWT as the write command WT of the memory device by comparing the allocated power budget with the cumulative adding signal PWR_SUM. The issue determining part 156 may issue the internal write command IWT as the write command WT of the memory device when the cumulative adding signal PWR_SUM is smaller than the allocated power budget, and may not generate the internal write command IWT to the memory device and output the issue suspension signal NO_ISSUE when the cumulative adding signal PWR_SUM is equal to or greater than the allocated power budget.

Figure 5:
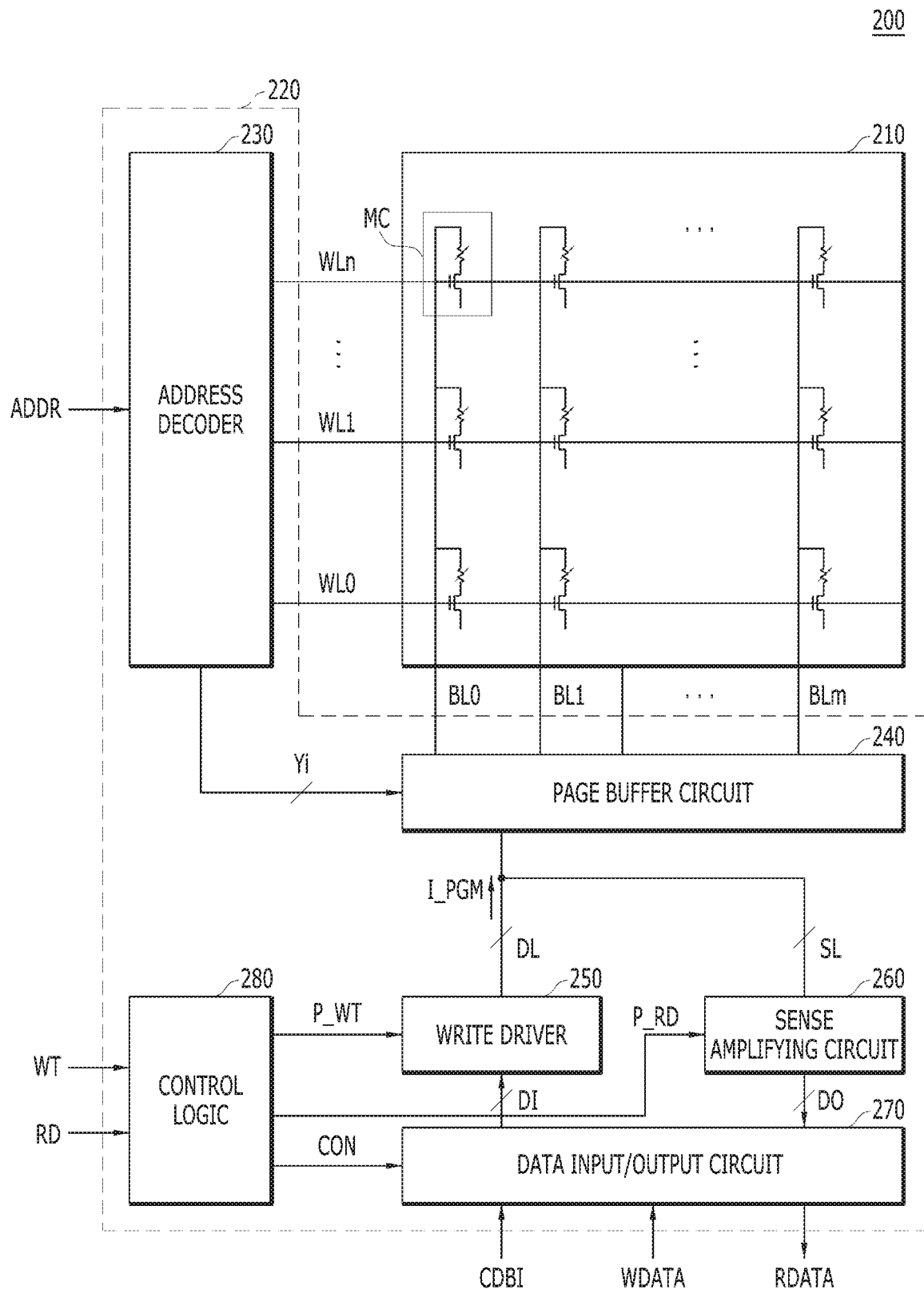
FIG. 5 is a block diagram illustrating a memory device shown in FIG. 3.

FIG. 5 is a block diagram illustrating the memory device 200 shown in FIG. 3.

Referring to FIG. 5, the memory device 200 may include the memory cell array 210 and the peripheral circuit 220. FIG. 5 illustrates a case where the memory cells MC of the memory cell array 210 are the resistive memory cells, which are described above with reference to FIGS. 1 and 2.

The peripheral circuit 220 may include an address decoder 230, a page buffer circuit 240, a write driver 250, a sense amplifying circuit 260, a data input/output buffer 270, and a control logic 280.

The control logic 280 may control the address decoder 230, the page buffer circuit 240, the write driver 250, the sense amplifying circuit 260 and the data input/output circuit 270. The control logic 280 may provide a pulse control signal P_WT to the write driver 250, a sense control signal P_RD to the sense amplifying circuit 260, and an input/output control signal CON to the data input/output circuit 270 in response to the write command WT and the read command RD.

The address decoder 230 may be coupled to the memory cell array 210 through word lines WL0 to WLn. The address decoder 230 may decode the address ADDR inputted from an external device to provide a bias voltage to a selected word line. Although not illustrated, the control logic 280 may provide a control signal for controlling the bias voltage to the address decoder 230. Also, the address decoder 230 may generate a selection signal Yi for selecting bit lines BL0 to BLm. The selection signal Yi may be provided to the page buffer circuit 240.

The page buffer circuit 240 may be coupled to the memory cell array 210 through the bit lines BL0 to BLm. The page buffer circuit 240 may select a bit line in response to the selection signal Yi provided from the address decoder 230. The page buffer circuit 240 may couple the bit line BL with a data line DL during the write operation and couple the bit line BL with a sense line SL during the read operation, in response to the selection signal Yi.

The write driver 250 may provide a program pulse I_PGM to the data line DL based on the pulse control signal P_WT and input data DI. The program pulse I_PGM may include the set pulse or the reset pulse.

The sense amplifying circuit 260 may sense and amplify a difference between a voltage of the sense line SL and a reference voltage VREF based on the sense control signal P_RD The sense amplifying circuit 260 may read out data stored in the target memory cell to provide the data as output data DO. The reference voltage VREF may be supplied from a reference voltage generation circuit (not illustrated).

The data input/output circuit 270 may provide the write data WDATA inputted from an external device as the input data DI based on the input/output control signal CON, or may output the output data DO provided from the sense amplifying circuit 260 as the read data RDATA to the memory controller (the reference numeral 100 of FIG. 3). The data input/output circuit 270 may determine whether or not to invert the bits of the write data WDATA based on the DBI information provided from the DBI control block 140 of the memory controller 100.

Since the set pulse for writing the low bit of the write data WDATA generally has a larger power consumption than the reset pulse for writing the high bit of the write data WDATA, a data bus inversion operation may be performed to increase the number of the reset pulse. By way of example but not limitation, since the low bit of the write data WDATA is the major bit when the DBI information is "0", the data input/output circuit 270 may invert the bits of the write data WDATA and provide the inverted bits as the input data DI. Since the high bit of the write data WDATA is the major bit when the DBI information is "1", the data input/output circuit 270 may retain the write data WDATA as it is and provide the write data WDATA as the input data DI.

Hereinafter, an exemplary operation of the memory system will be described with reference to FIGS. 1 to 6.

Figure 6:
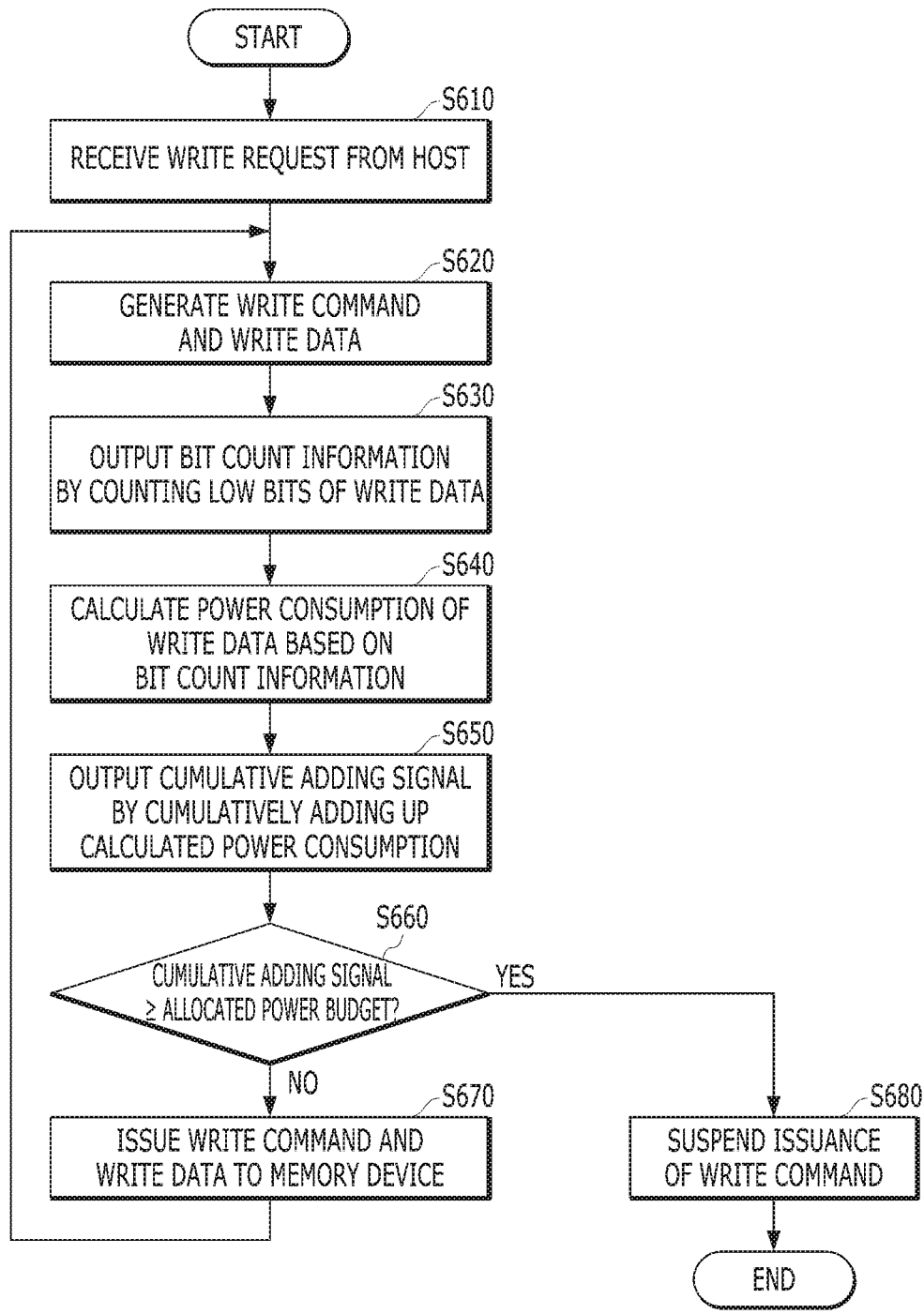
FIG. 6 is a flowchart illustrating an operating method of a memory controller shown in FIG. 3.

FIG. 6 is a flowchart illustrating an operating method of the memory controller 100 shown in FIG. 3.

Referring to FIG. 6, when the write request is inputted from the host in step S610, the command generation block 120 may generate the internal write command IWT, and the data processing block 130 may generate the write data WDATA, in step S620. The address generation block 110 may generate the address ADDR.

The DBI control block 140 may count the low bit or the high bit of the write data WDATA, determine the DBI information CDBI corresponding to the write data WDATA based on a counting result, and provide the determined DBI information CDBI to the memory device 200. Also, the DBI control block 140 may count the low bit or the high bit of the write data WDATA based on the DBI information CDBI, thereby outputting the bit count information BIT_NUM in step S630.

The command scheduling block 150 may calculate the amount of power consumption depending on the bit count information BIT_NUM and determine whether or not to issue the internal write command IWT as the write command WT of the memory device 200 based on the value obtained by cumulatively adding up the calculated amount of power consumption.

More specifically, the power calculation part 152 may calculate the amount of power consumption depending on the bit count information BIT_NUM to generate the power data PWR_DATA in step S640. The power calculation part 152 may be configured to multiply the high bit information 1'S included in the bit count information BIT_NUM by the first power amount ASP required for applying the reset pulse, multiply the low bit information 0'S included in the bit count information BIT_NUM by the second power amount CSP required for applying the set pulse and add up the values obtained by the multiplication, thereby outputting the power data PWR_DATA.

In step S650, the cumulative adding part 154 may cumulatively add up the power data PWR_DATA and the power data PWR_DATA, which was previously calculated, in response to the internal write command IWT, thereby outputting the cumulative adding signal PWR_SUM.

In step S660, the issue determining part 156 may compare the cumulative adding signal PWR_SUM with the allocated power budget.

When the cumulative adding signal PWR_SUM is smaller than the allocated power budget (that is, "NO" in step S660), the issue determining part 156 may issue the internal write command IWT as the write command WT of the memory device 200 and transfer the write data WDATA to the memory device 200 in step S670. The foregoing steps S620 to S670 may repeat until the cumulative adding signal PWR_SUM is equal to or greater than the allocated power budget, whereby the number of the write commands may be adjusted within the allocated power budget.

When the cumulative adding signal PWR_SUM is equal to or greater than the allocated power budget (that is, "YES" in step S660), the issue determining part 156 may not issue the internal write command IWT to the memory device and output the issue suspension signal NO_ISSUE in step S680. The command generation block 120 may suspend additional generation of the internal write command IWT in response to the issue suspension signal NO_ISSUE.

The control logic 280 of the memory device 200 may generate the pulse control signal P_WT and the input/output control signal CON based on the write command WT provided from the issue determining part 156. The data input/output circuit 270 may determine whether or not to invert the bits of the write data WDATA based on the DBI information CDBI and provide the write data WDATA as the input data DI based on the input/output control signal CON. The write driver 250 may apply the program pulse I_PGM including the set pulse or the reset pulse to the target memory cell corresponding to the address ADDR based on the pulse control signal P_WT and the input data DI.

As described above, the present invention may calculate power consumed depending on the number of low bits or high bits, of the write data and schedule the write command based on a value obtained by cumulatively adding up the calculated amount of power consumption, thereby efficiently managing a power budget and improving performance of the write operation.

For example, when the ratio of the power consumed for writing the low bit and high bit of the write data WDATA in the memory cell array 210 is 2:1, then the low bit and high bit of the write data WDATA having 512 bits consist of 256 bits, respectively. The amount of power consumption calculated in consideration of the worst power condition is 1024=(2*(256+256)) per write data according to a conventional method, while the amount of power consumption calculated in consideration of the number of the low bits or high bits, of the write data is 768=(3*256+1*256) per write data according to an embodiment of the disclosure. Therefore, if the write command is scheduled only three times for a period of 5 us in the conventional method, the write command may be scheduled up to four times for the period of 5 us in an embodiment of the disclosure. Also, under the same situation, when all the 512 bits of the write data WDATA are composed of the high bits, the amount of power consumption calculated according to an embodiment of the disclosure may become 512=(=1*256+1*256) per write data so that the write command may be scheduled up to six times for the period of 5 us. As a result, the performance of the write operation may be doubled relative to a conventional write operation.

Hereinafter, a method for performing a command scheduling operation according to the disclosure in various write operations will be described.

The memory system may perform a partial write operation (or a masked write operation) in which only a part of the bit of the write data is written in the memory cell array among the write operations. During the partial write operation, internal data previously stored in the target memory cell may be compared with data to be written in the target memory cell, and only the changed bit as a result of comparison may be written. Therefore, in order to perform the partial write operation, it is necessary to perform an internal read operation of reading out existing data and to perform a write operation of writing only the changed bit by comparing the read-out existing data with new write data.

Figure 7:
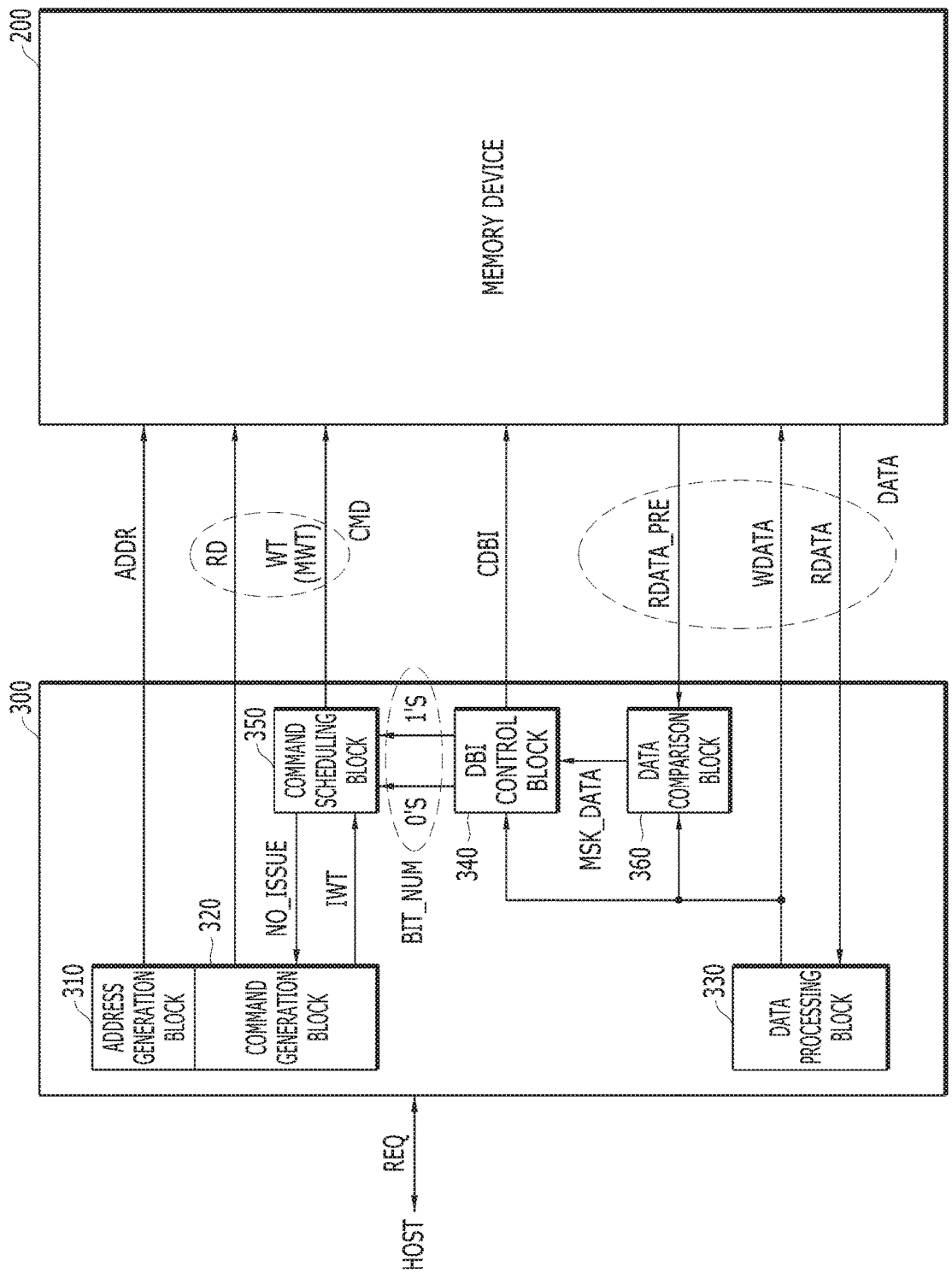
FIG. 7 is a block diagram illustrating a memory system in accordance with an embodiment of the present invention.

FIG. 7 is a block diagram illustrating a memory system in accordance with an embodiment of the disclosure.

Referring to FIG. 7, the memory system may include a memory controller 300 and a memory device 200.

The memory device 200 shown in FIG. 7 is substantially the same as the memory device 200 shown in FIG. 3. However, when a partial write command MWT notifying a partial write operation and an address ADDR are inputted from the memory controller 300, the memory device 200 of FIG. 7 may perform an internal read operation to read out internal read data RDATA_PRE from a target memory cell corresponding to the address ADDR and provide the internal read data RDATA_PRE to the memory controller 300.

The memory controller 300 may include an address generation block 310, a command generation block 320, a data processing block 330, a data bus inversion (DBI) control block 340, a command scheduling block 350, and a data comparison block 360.

Since the address generation block 310, the command generation block 320 and the data processing block 330 of the memory controller 300 shown in FIG. 7 are substantially the same as the address generation block 110, the command generation block 120 and the data processing block 130 shown in FIG. 3, detailed descriptions thereof are omitted herein.

The data comparison block 360 may compare the internal read data RDATA_PRE, read out from the memory device 200, with write data WDATA so as to output masking data MSK_DATA. The data comparison block 360 may perform a XOR operation on bits of the write data WDATA and bits of the internal read data RDATA_PRE to output the masking data MSK_DATA. By way of example but not limitation, when the write data WDATA is "000111" and the internal read data RDATA_PRE is "001000," the data comparison block 360 may output the masking data MSK_DATA of "001111". In other words, the data comparison block 360 may compare the bits of the write data WDATA with the bits of the internal read data RDATA_PRE to output the masking data MSK_DATA in which changed parts are set to high bits.

The DBI control block 340 may determine data bus inversion (DBI) information CDBI corresponding to the masking data MSK_DATA based on the number of high bits of the masking data MSK_DATA. By way of example but not limitation, the DBI control block 340 may determine the DBI information CDBI as "0" when the high bit of the masking data MSK_DATA of "001111" is the major bit. In other words, since the fact that the high bit of the masking data MSK_DATA is the major bit means that there are a plurality of data to be written, the DBI control block 340 may set the DBI information CDBI so that the number of the data to be written is reduced, that is, the write data WDATA is inverted.

In addition, the DBI control block 340 may count a low bit or a high bit of the write data WDATA based on the DBI information CDBI of the masking data MSK_DATA, and may provide bit count information BIT_NUM to the command scheduling block 350. By way of example but not limitation, when the DBI information CDBI of the masking data MSK_DATA is "1", the DBI control block 340 may count a high bit and a low bit of data that masks the write data WDATA to the masking data MSK_DATA, thereby providing high bit information 1'S and low bit information 0'S of the bit count information BIT_NUM to the command scheduling block 350. When the DBI information CDBI of the masking data MSK_DATA is "0", the DBI control block 340 may count a high bit and a low bit of data, which masks inverted write data to inverted masking data, to provide the high bit information 1'S and the low bit information 0'S of the bit count information BIT_NUM to the command scheduling block 350.

The command scheduling block 350 may calculate the amount of power consumption depending on the bit count information BIT_NUM and adjust the number of write commands WT applied to the memory device 200 during a write operation based on a value obtained by cumulatively adding up the calculated amount of power consumption. Since the command scheduling block 350 shown in FIG. 7 is substantially the same as the command scheduling block 150 shown in FIG. 3, detailed descriptions thereof are omitted herein.

FIG. 8 is a table for describing an operation of the memory controller 300 shown in FIG. 7.

Referring to FIG. 8, in a case of CASE 1, when the write data WDATA is "1100 1111" and the internal read data RDATA_PRE is "1111 0000," the data comparison block 360 may output the masking data MSK_DATA of "0011 1111." The DBI control block 340 may determine the DBI information CDBI as "0" because the high bit of the masking data MSK_DATA is the major bit, and may count a low bit of data, which masks inverted write data /WDATA to inverted masking data /MSK_DATA, to provide the low bit information 0'S of the bit count information BIT_NUM to the command scheduling block 350.

In a case of CASE2, when the write data WDATA is "1111 0011" and the internal read data RDATA_PRE is "1111 0000," the data comparison block 360 may output the masking data MSK_DATA of "0000 0011." The DBI control block 340 may determine the DBI information CDBI is "1" because the low bit of the masking data MSK_DATA is the major bit, and may count a high bit of data that masks the write data WDATA to the masking data MSK_DATA, thereby providing the high bit information 1'S of the bit count information BIT_NUM to the command scheduling block 350.

In a case of CASE 3, when the write data WDATA is "1100 0011" and the internal read data RDATA_PRE is "0011 0011," the data comparison block 360 may output the masking data MSK_DATA of "1111 1100." The DBI control block 340 may determine the DBI information CDBI as "0," and may count the low bit of the data, which masks the inverted write data /WDATA to the inverted masking data/

MSK_DATA, to output the low bit information 0'S of the bit count information BIT_NUM to the command scheduling block 350.

As described above, even when the partial write operation is performed, power consumed depending on the number of low bits or high bits of data to be written may be calculated, write commands may be scheduled based on the calculated amount of power consumption, whereby performance of the write operation may be improved.

Figure 9:
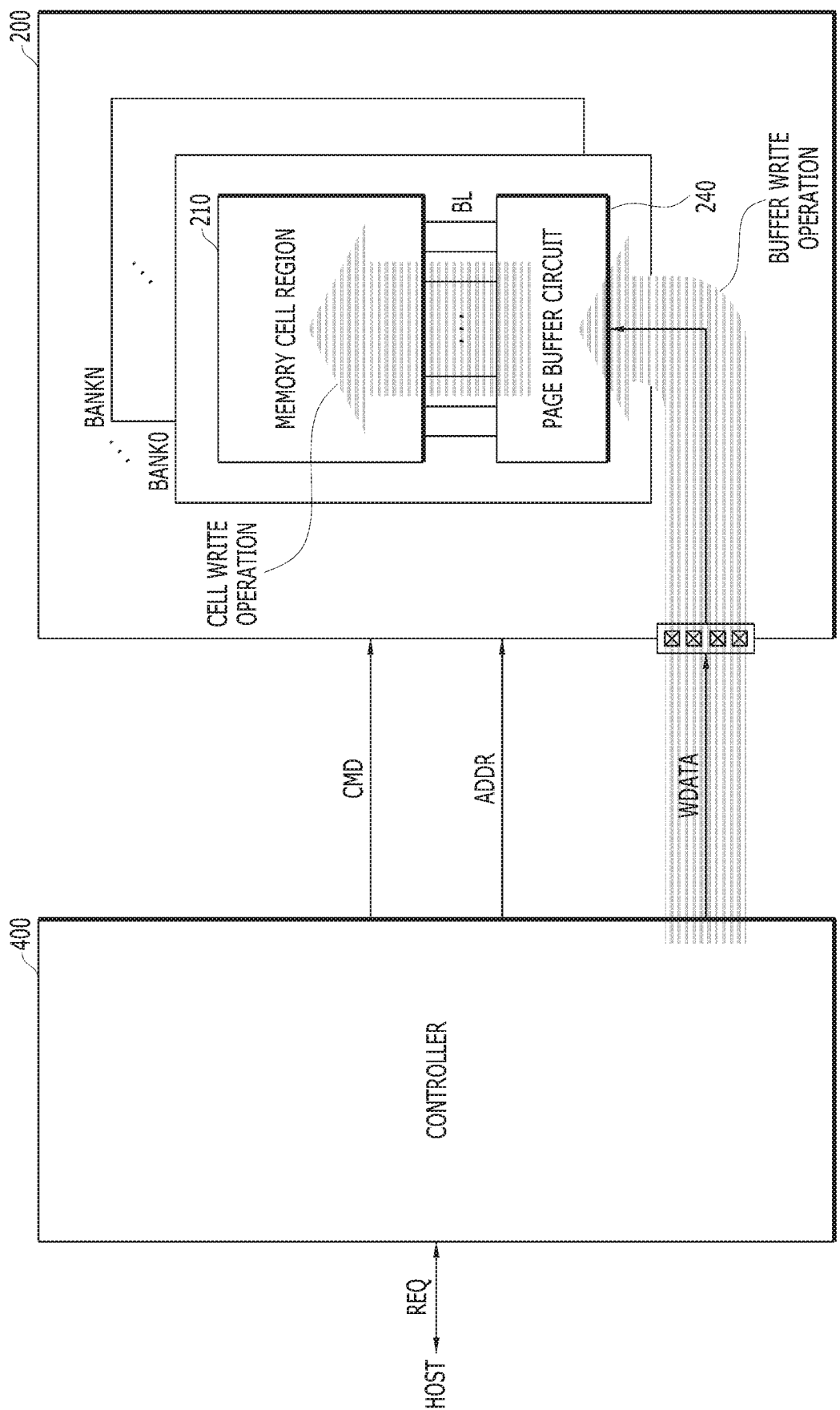
FIG. 9 is a block diagram illustrating a buffer write operation and a cell write operation.

FIG. 9 is a block diagram illustrating a buffer write operation and a cell write operation.

Referring to FIG. 9, a memory system may perform a write operation which is divided into the buffer write operation and the cell write operation.

When a memory controller 400 receives a write request REQ from a host, a memory controller 400 may provide write data WDATA to a memory device 200 in order to control the buffer write operation of the memory device 200 so that the write data WDATA is stored in a page buffer circuit 240. The memory controller 400 may transmit a buffer write command to the memory device 200 in order to control the buffer write operation of the memory device 200.

In addition, the memory controller 400 may control the cell write operation of the memory device 200 so that data stored in the page buffer circuit 240 is stored in a target memory cell of a memory cell array 210. The memory controller 400 may control the cell write operation of the memory device 200 after being notified of completion of the buffer write operation from the memory device 200. The memory controller 400 may transmit a cell write command to the memory device 200 in order to control the cell write operation of the memory device 200.

The cell write operation may be performed subsequent to the buffer write operation. The buffer write operation and the cell write operation may be performed continuously or discontinuously. When the memory device 200 includes a plurality of banks BANK0 to BANKN, each having the memory cell array 210 and the page buffer circuit 240, the buffer write operations may be performed on requested banks, and a plurality of cell write operations corresponding to the buffer write operations may be performed subsequently. By way of example but not limitation, cell write operations may start after all buffer write operations are achieved. After a first buffer write operation corresponding to a first bank BANK0, a second buffer write operation corresponding to a second bank BANK1 and a third buffer write operation corresponding to a third bank BANK2 are performed, a first cell write operation, a second cell write operation and a third cell write operation corresponding to the first to third buffer write operations respectively may be performed.

Since a program pulse is not applied to the memory cell array 210 during the buffer write operation, power consumption due to the buffer write operation may be almost zero. Meanwhile, since the program pulse is applied to the memory cell array 210 during the cell write operation, the power consumption due to the buffer write operation may be substantially the same as power consumption caused by a general write operation.

Figure 10:
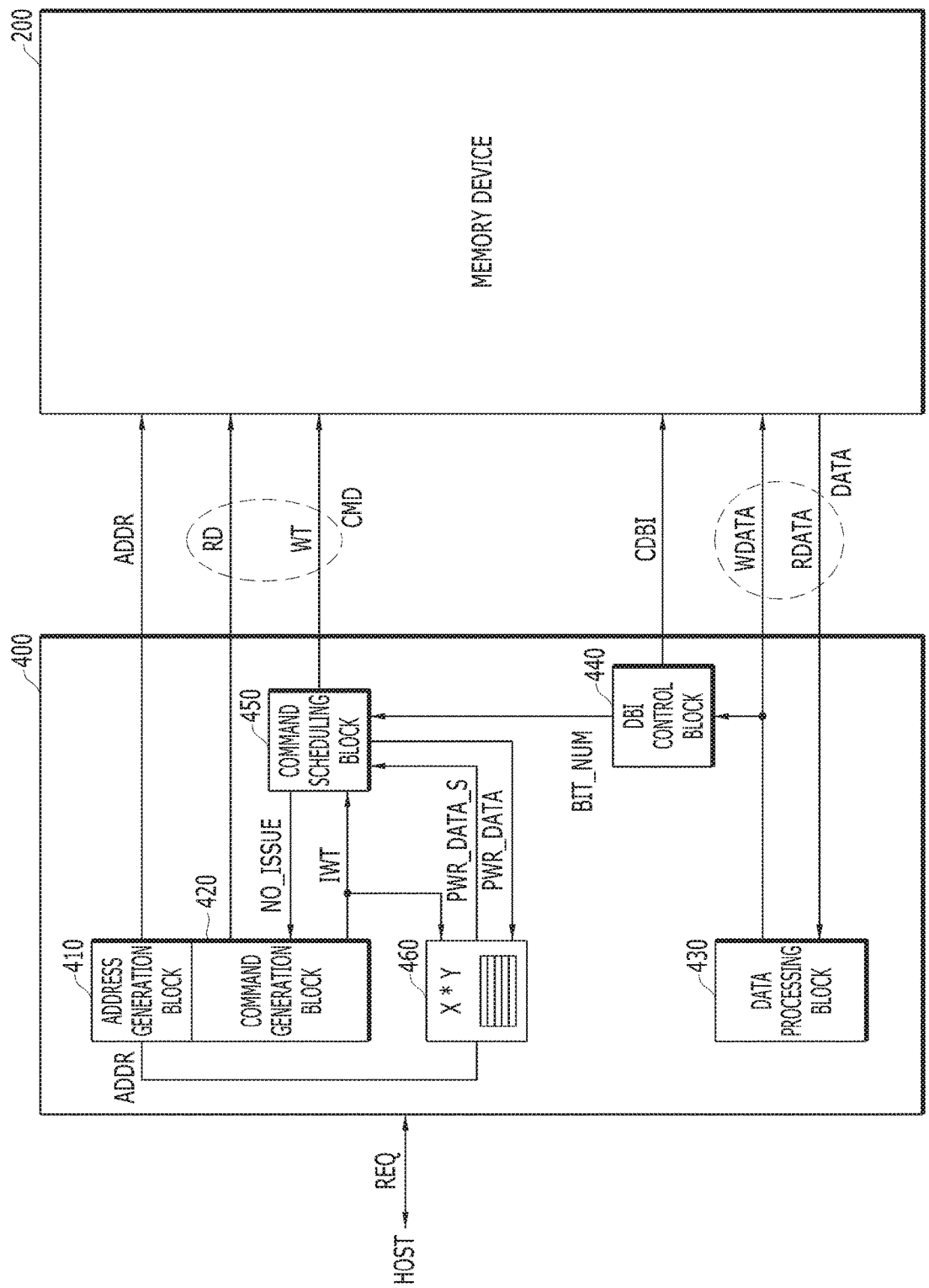
FIG. 10 is a block diagram illustrating a memory system in accordance with an embodiment of the present invention.

FIG. 10 is a block diagram illustrating a memory system in accordance with an embodiment of the disclosure.

Referring to FIG. 10, the memory system may include a memory controller 400 and a memory device 200.

The memory device 200 shown in FIG. 10 is substantially the same as the memory device 200 shown in FIG. 3. However, when a buffer write command BWT notifying a buffer write operation is issued, the memory device 200 of FIG. 10 may store write data WDATA provided from the memory controller 400 in an internal page buffer circuit (not illustrated). When a cell write command CWT notifying a cell write operation is issued, the memory device 200 of FIG. 10 may store data stored in the page buffer circuit in a target memory cell. An internal write command IWT shown in FIG. 10 may include the buffer write command BWT and the cell write command CWT.

The memory controller 400 may include an address generation block 410, a command generation block 420, a data processing block 430, a data bus inversion (DBI) control block 440, a command scheduling block 450, and a power data table 460.

Since the address generation block 410, the command generation block 420 and the data processing block 430 of the memory controller 400 shown in FIG. 10 are substantially the same as the address generation block 110, the command generation block 120 and the data processing block 130 shown in FIG. 3, detailed descriptions thereof are omitted herein.

The DBI control block 440 may count the number of low bits or high bits of the write data WDATA and determine DBI information CDBI corresponding to the write data WDATA based on a counting result during the buffer write operation. Also, the DBI control block 440 may count the low bits or the high bits of the write data WDATA based on the DBI information CDBI, thereby providing bit count information BIT_NUM to the command scheduling block 450 during the buffer write operation.

The command scheduling block 450 may calculate the amount of power consumption depending on the bit count information BIT_NUM to output power data PWR_DATA during the buffer write operation, and may adjust the number of write commands WT applied to the memory device 200 based on a value obtained by cumulatively adding up storage power data PWR_DATA_S during the cell write operation.

The power data table 460 may store the power data PWR_DATA outputted from the command scheduling block 450 based on an address ADDR during the buffer write operation and output the storage power data PWR_DATA_S to the command scheduling block 450 based on the address ADDR during the cell write operation. The power data table 460 may distinguish the buffer write operation from the cell write operation based on the received internal write command IWT including the buffer write command BWT and the cell write command CWT.

Figure 11A:
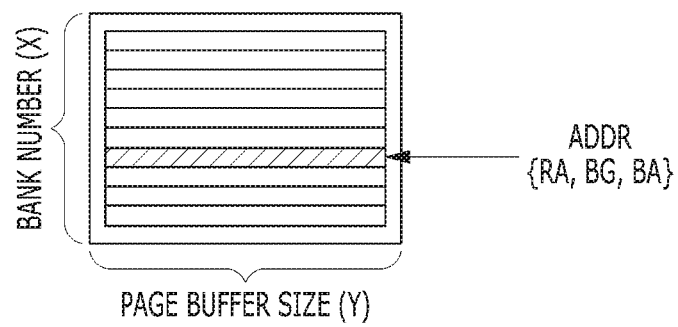
FIG. 11A is a diagram for describing a configuration of a power data table shown in FIG. 10.
Figure 11B:
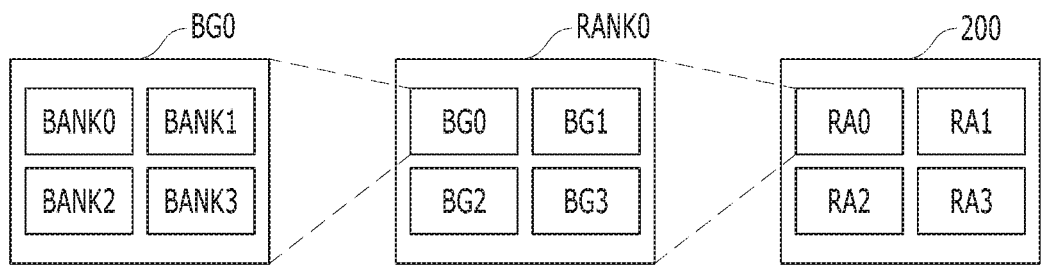
FIG. 11B is a diagram for describing a configuration of an address corresponding to a memory device shown in FIG. 10.

FIG. 11A is a diagram for describing a configuration of the power data table 460 shown in FIG. 10. FIG. 11B is a diagram for describing a configuration of the address ADDR corresponding to the memory device 200 shown in FIG. 10.

Referring to FIG. 11A, the power data table 460 may have a field number X corresponding to the number of banks (BANK0 to BANKN shown in FIG. 9), i.e., N+1, and each field may have a size Y corresponding to the number of bits of the power data PWR_DATA.

Referring to FIG. 11B, a multi-rank structure where the memory device 200 includes a plurality of ranks is illustrated. By way of example but not limitation, when the memory device 200 includes four ranks RANK0 to RANK3, each having four bank groups BG0 to BG3, each having four banks BANK0 to BANK3, the memory device 200 may include 64=(4*4*4) banks. At this time, when the amount of power consumption is a range of 512 to 1024 per write data, the power data table 460 may include 64 fields, each of which is composed of 10 bits, and thus the size of the power data table 460 may be 64(X)*10(Y). However, this is merely an example, and a configuration and number of the banks of the memory device 200 of the disclosure is not limited thereto.

Referring back to FIG. 11A, since the fields of the power data table 460 correspond to the banks BANK0 to BANKN, respectively, each of the fields may be designated by the address ADDR including bank information. In an embodiment of the memory device 200 having a structure of FIG. 11B, the address ADDR may be configured to include rank information, bank group information and bank information. By way of example but not limitation, each of the fields of the power data table 460 may be designated based on the address ADDR including an rank address RA, a bank group address BG and a bank address BA. However, this is merely an example, and a configuration of the address ADDR of the present invention is not limited thereto. The address ADDR may be configured to include a bank address for designating a bank depending on a configuration of the memory device 200.

Figure 12:
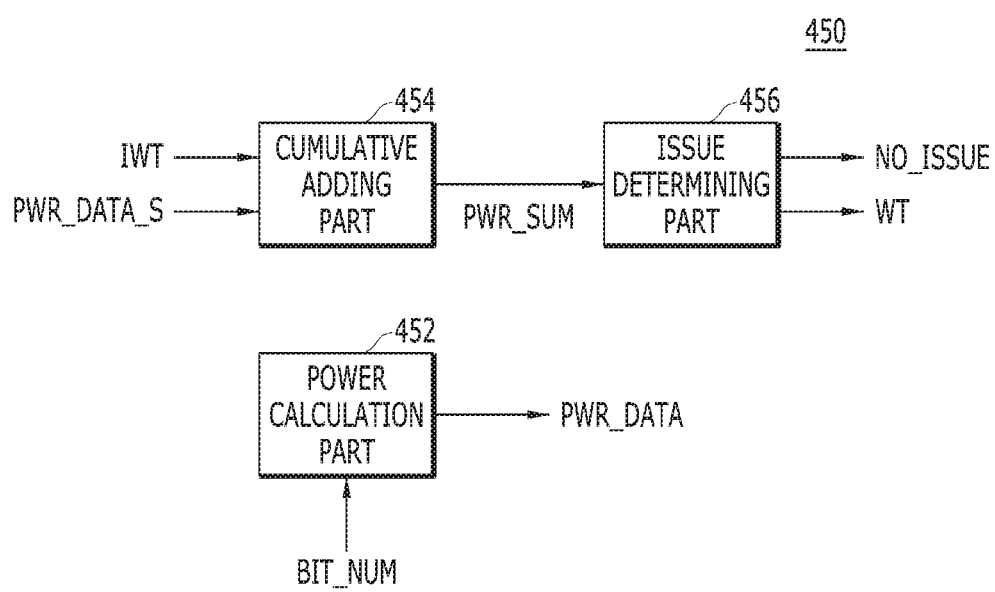
FIG. 12 is a block diagram illustrating a command scheduling block shown in FIG. 10.

FIG. 12 is a block diagram illustrating the command scheduling block 450 shown in FIG. 10.

Referring to FIG. 12, the command scheduling block 450 may include a power calculation part 452, a cumulative adding part 454, and an issue determining part 456. The power calculation part 452, the cumulative adding part 454 and the issue determining part 456 shown in FIG. 12 has substantially the same configuration as the power calculation part 152, the cumulative adding part 154 and the issue determining part 156 shown in FIG. 4.

The power calculation part 452 may calculate the amount of power consumption based on the bit count information BIT_NUM to generate the power data PWR_DATA and may provide the power data PWR_DATA to the power data table 460. The cumulative adding part 454 may cumulatively add up the storage power data PWR_DATA_S provided from the power data table 460 to output a cumulative adding signal PWR_SUM when the cell write command CWT notifying the cell write operation is generated. In other words, whenever the cell write command CWT is received, the cumulative adding part 454 may cumulatively add up the storage power data PWR_DATA_S provided from the power data table 460, thereby outputting the cumulative adding signal PWR_SUM.

Figure 13A:
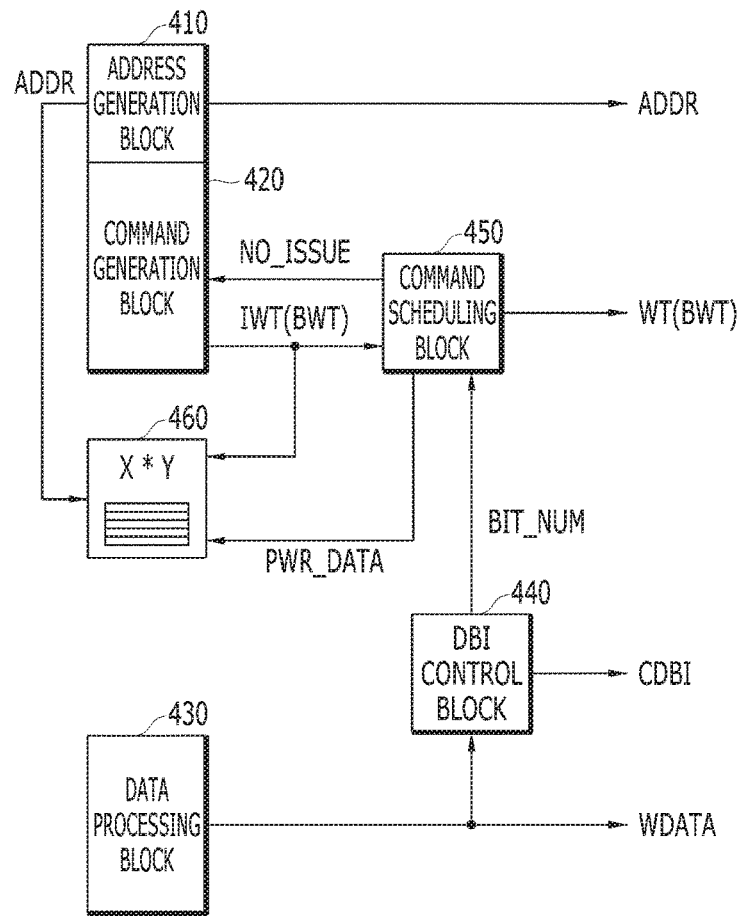
FIGS. 13A and 13B are block diagrams illustrating an operating method of a memory system shown in FIG. 10.
Figure 13B:
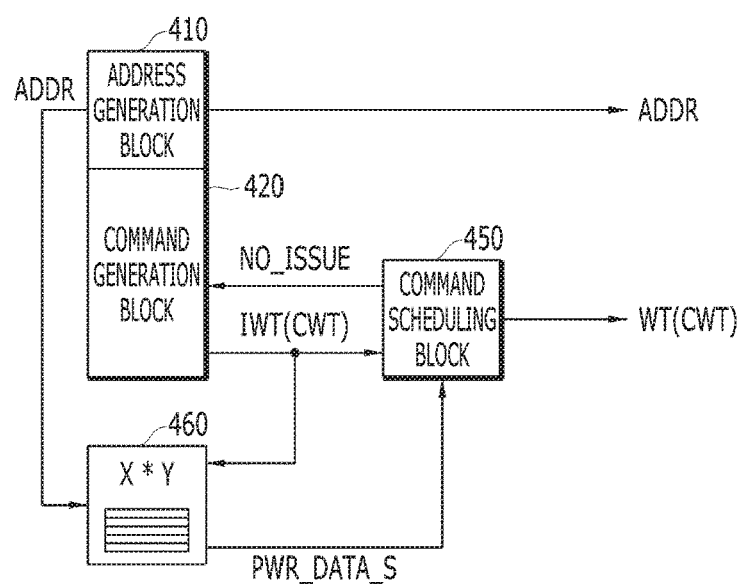

FIGS. 13A and 13B are block diagrams illustrating an operating method of the memory system shown in FIG. 10. FIG. 13A is a block diagram illustrating the buffer write operation of the memory system shown in FIG. 10, and FIG. 13B is a block diagram illustrating the cell write operation of the memory system shown in FIG. 10.

Referring to FIG. 13A, when a write request is inputted from a host, the command generation block 420 may generate the internal write command IWT while the data processing block 430 may generate the write data WDATA. The internal write command IWT may include the buffer write command BWT notifying the buffer write operation. The address generation block 410 may generate the address ADDR. The address ADDR may include the bank address.

The DBI control block 440 may count the number of the low bits or the high bits of the write data WDATA and determine the DBI information CDBI corresponding to the write data WDATA based on the counting result which is provided to the memory device 200. Also, the DBI control block 440 may invert the low bits or the high bits of the write data WDATA based on the DBI information CDBI, thereby outputting the bit count information BIT_NUM.

The power calculation part 452 of the command scheduling block 450 may calculate the amount of power consumption based on the bit count information BIT_NUM to generate the power data PWR_DATA and may provide the power data PWR_DATA to the power data table 460.

The power data table 460 may store the power data PWR_DATA in a field designated by the bank address of the address ADDR in response to the buffer write command BWT.

The memory device 200 may receive the buffer write command BWT, the address ADDR and the write data WDATA. The memory device 200 may determine whether or not to invert the bits of the received write data WDATA based on the DBI information CDBI, and may store the write data WDATA in a page buffer circuit of a bank corresponding to the address ADDR. Consequently, the buffer write operation may be completed.

The buffer write operation may be repeatedly performed for each bank. Accordingly, the power data table 460 may store the power data PWR_DATA corresponding to each bank in each field.

Referring to FIG. 13B, when the write request is inputted from the host, the command generation block 420 may generate the internal write command IWT. The internal write command IWT may include the cell write command CWT notifying the cell write operation. The address generation block 410 may generate the address ADDR. The address ADDR may include the bank address.

The power data table 460 may output the storage power data PWR_DATA_S from a field designated by the bank address of the address ADDR in response to the cell write command CWT.

When the cell write command CWT is inputted, the cumulative adding part 454 may cumulatively add up the storage power data PWR_DATA_S outputted from the power data table 460 so as to output the cumulative adding signal PWR_SUM. The issue determining part 456 may determine whether or not to issue the internal write command IWT as the write command WT of the memory device by comparing the cumulative adding signal PWR_SUM with an allocated power budget.

The memory device 200 may receive the cell write command CWT and the address ADDR. The memory device 200 may apply a program pulse I_PGM including a set pulse or a reset pulse depending on data stored in a page buffer circuit of a bank corresponding to the cell write command CWT and the address ADDR to the target memory cell. Consequently, the cell write operation may be completed.

As described above, according to an embodiment of the disclosure, an electrical power consumed depending on the number of low bits or high bits of the write data may be calculated, and the calculated power consumption may be stored in the power data table during the buffer write operation. Subsequently, during the cell write operation for writing the write data in the memory cell, the write command may be scheduled based on a value obtained by cumulatively adding up the power consumption stored in the power data table. As a result, the performance of the write operation may be improved.

Figure 14:
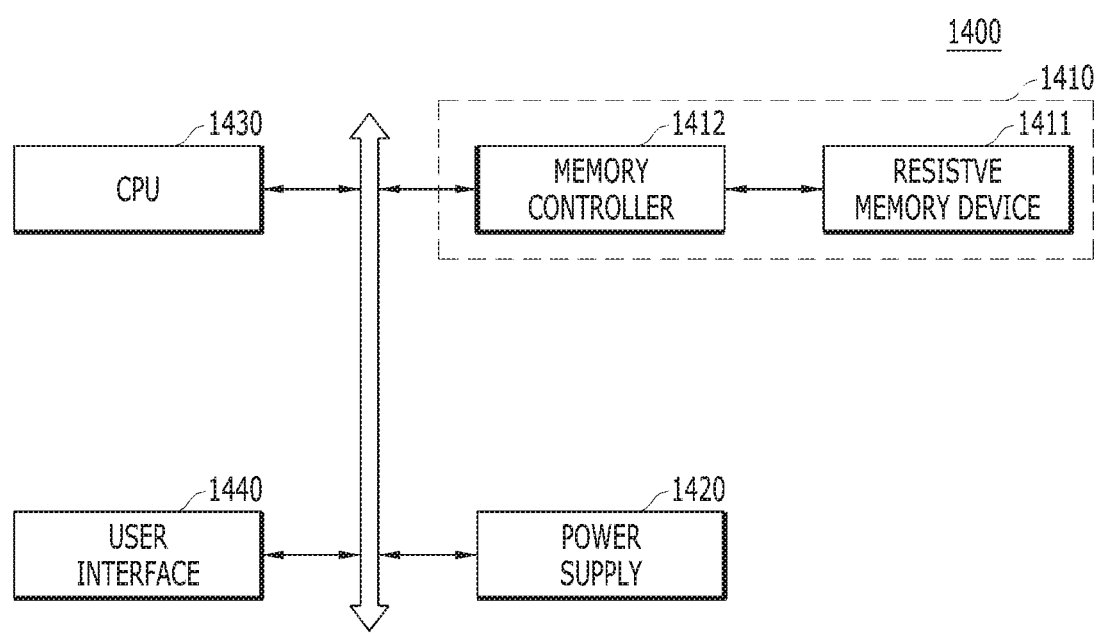
FIG. 14 is a block diagram illustrating a computing system including a resistive memory device in accordance with an embodiment of the present invention.

FIG. 14 is a block diagram illustrating a computing system 1400 including a resistive memory device in accordance with an embodiment of the disclosure.

Referring to FIG. 14, the computing system 1400 may be constituted with a memory system 1410 including a resistive memory device 1411 and a memory controller 1412, a central processing unit (CPU) 1430 electrically connected to a system bus 1450, an user interface 1440, and a power supply device 1420.

Data, which is handled by the user interface 1440 or processed by the CPU 1430, may be stored in the resistive memory device 1411 through the memory controller 1412. The memory system 1410 shown in FIG. 14 may be implemented with any one of the memory systems shown in FIGS. 3, 7 and 10. Therefore, power consumed depending on the number of low bits or high bits of the write data may be calculated, as well as the write command may be scheduled based on the calculated power consumption, whereby the performance of the write operation may be enhanced.

Although not illustrated in the drawing, it is obvious to those skilled in the art that an application chipset, a camera image processor (CIS), a mobile DRAM and the like may be further embodied with the computing system.

As is apparent from the above descriptions, the memory system in accordance with the embodiments of the present invention may efficiently manage the power budget and improve the performance of the write operation by adjusting the number of write commands applied to the resistive memory device according to the number of high bits or low bits of the write data.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A memory system comprising:
a memory cell array including a plurality of resistive memory cells;
a peripheral circuit suitable for providing a set pulse or a reset pulse which corresponds to write data into a selected memory cell among the resistive memory cells, based on a write command; and
a memory controller suitable for providing the write command with the write data to the peripheral circuit and scheduling the write command based on an amount of power consumption calculated depending on the number of either low bits or high bits in the write data.

2. The memory system of claim 1, wherein the peripheral circuit applies the set pulse when the low bits of the write data are written, and applies the reset pulse when the high bits of the write data are written.

3. The memory system of claim 1, wherein when the write data is generated, the memory controller calculates the amount of power consumption based on data bus inversion (DBI) information of the write data and adjusts a number of write commands applied to the peripheral circuit for a predetermined period based on a value obtained by cumulatively adding up the calculated amount of power consumption.

4. The memory system of claim 1, wherein the memory controller includes:
a DBI control block suitable for outputting bit count information by counting the number of the low bits or the high bits based on the DBI information of the write data; and
a command scheduling block suitable for calculating the amount of power consumption based on the bit count information and adjusting the number of write commands applied to the peripheral circuit for a predetermined period based on a value obtained by cumulatively adding up the calculated amount of power consumption.

5. The memory system of claim 4, wherein
the DBI control block counts the number of the low bits to output as low bit information of the bit count information and counts the number of the high bits to output as high bit information of the bit count information, when the DBI information of the write data is a first logic level, and
the DBI control block counts the number of the high bits to output as the low bit information and counts the number of the low bits to output as the high bit information, when the DBI information of the write data is a second logic level.

6. The memory system of claim 4, wherein the command scheduling block includes:
a power calculation part suitable for calculating the amount of power consumption based on the bit count information to output power data;
a cumulative adding part suitable for cumulatively adding up the power data in response to the write command to output a cumulative adding signal; and
an issue determining part suitable for determining whether or not to issue the write command by comparing the cumulative adding signal with an allocated power budget.

7. The memory system of claim 6, wherein the power calculation part includes:
a power set unit suitable for setting a first power amount required for applying the reset pulse and a second power amount required for applying the set pulse; and
an arithmetic operation unit suitable for multiplying the high bit information included in the bit count information by the first power amount, multiplying the low bit information included in the bit count information by the second power amount and adding up values obtained by the multiplication to output the power data.

8. The memory system of claim 6, wherein the issue determining part issues the write command when the cumulative adding signal is smaller than the allocated power budget and controls whether to suspend generation of the write command when the cumulative adding signal is equal to or greater than the allocated power budget.

9. The memory system of claim 1, wherein the memory controller includes:
a data comparison block suitable for comparing the write data with read data outputted from the memory cell array to output masking data;
a DBI control block suitable for outputting bit count information by counting the number of the low bits or high bits of the write data based on DBI information of the masking data; and
a command scheduling block suitable for calculating the amount of power consumption based on the bit count information and adjusting a number of write commands applied to the peripheral circuit for a predetermined period based on a value obtained by cumulatively adding up the calculated amount of power consumption.

10. The memory system of claim 9, wherein the data comparison block performs a XOR operation on bits of the write data and bits of the read data to output the masking data.

11. The memory system of claim 1, wherein a write operation is divided into a first write operation in which the write data is stored from the memory controller into the peripheral circuit and a second write operation in which the write data is stored from a page buffer circuit of the peripheral circuit into the memory cell array.

12. The memory system of claim 11, wherein the memory controller includes:
- a DBI control block suitable for outputting bit count information by counting the number of the low bits or high bits of the write data based on DBI information of the write data during the first write operation;
- a power calculation block suitable for calculating the amount of power consumption based on the bit count information;
- a power data table suitable for storing the calculated amount of power consumption based on an address during the first write operation and outputting the stored amount of power consumption based on the address during the second write operation;
- a cumulative adding block suitable for cumulatively adding up the amount of power consumption provided from the power data table to output a cumulative adding signal during the second write operation; and
- an issue determining block suitable for determining whether or not to issue the write command by comparing the cumulative adding signal with an allocated power budget.

13. The memory system of claim 12, wherein the power calculation block includes:
- a power set unit suitable for setting a first power amount required for applying the reset pulse and a second power amount required for applying the set pulse; and
- an arithmetic operation unit suitable for multiplying high bit information included in the bit count information by the first power amount, multiplying low bit information included in the bit count information by the second power amount and adding up values obtained by the multiplication to calculate the amount of power consumption.

14. The memory system of claim 12, wherein the issue determining block issues the write command when the cumulative adding signal is smaller than the allocated power budget and controls to suspend generation of the write command when the cumulative adding signal is equal to or greater than the allocated power budget.

15. An operating method of a memory system, comprising:
- generating a write command and a write data;
- calculating an amount of power consumption depending on a number of low bits or high bits in the write data and issuing the write command with the write data to a memory device based on a value obtained by cumulatively adding up the calculated amount of power consumption; and
- providing, by the memory device, a set pulse or a reset pulse corresponding to the write data to a selected memory cell among resistive memory cells based on the write command.

16. The operating method of claim 15, wherein the memory device applies the set pulse to the selected memory cell when the low bits of the write data are written, and applies the reset pulse to the selected memory cell when the high bits of the write data are written.

17. The operating method of claim 15, wherein the issuing of the write command and the write data to the memory device includes:
- outputting bit count information by counting the number of the low bits or high bits based on DBI information of the write data;
- calculating the amount of power consumption based on the bit count information;
- outputting a cumulative adding signal by cumulatively adding up the amount of power consumption in response to the write command; and
- determining whether or not to issue the write command to the memory device by comparing the cumulative adding signal with an allocated power budget.

18. The operating method of claim 17, wherein the calculating of the amount of power consumption includes:
- setting a first power amount required for applying the reset pulse and a second power amount required for applying the set pulse;
- multiplying high bit information included in the bit count information by the first power amount and multiplying low bit information included in the bit count information by the second power amount; and
- adding up values obtained by the multiplication and calculating the added values as the amount of power consumption.

19. The operating method of claim 17, wherein the determining of whether or not to issue the write command includes:
- issuing the write command when the cumulative adding signal is smaller than the allocated power budget; and
- suspending generation of the write command when the cumulative adding signal is equal to or greater than the allocated power budget.

20. The operating method of claim 15, wherein the issuing of the write command and the write data to the memory device includes:
- outputting masking data by comparing the write data with read data outputted from the memory device;
- outputting bit count information by counting the number of the low bits or high bits of the write data based on DBI information of the masking data;
- calculating the amount of power consumption based on the bit count information;
- outputting a cumulative adding signal by cumulatively adding up the amount of power consumption in response to the write command; and
- determining whether or not to issue the write command to the memory device by comparing the cumulative adding signal with an allocated power budget.

21. An operating method of a memory system, comprising:
- generating a write command and write data;
- calculating an amount of power consumption depending on a number of low bits or high bits in the write data;
- storing the calculated amount of power consumption in a power data table based on an address when the write command commands a first write operation;
- cumulatively adding up the amount of power consumption stored in the power data table based on the address when the write command commands a second write operation;
- issuing the write command and the write data to a memory device based on a value obtained by cumulatively adding up the amount of power consumption; and
- providing, by the memory device, a set pulse or a reset pulse corresponding to the write data to a selected memory cell among resistive memory cells based on the write command.

22. The operating method of claim 21, wherein
the first write operation is performed to store the write data from the memory controller into a page buffer circuit of the memory device, and the second write operation is performed to store the write data from the page buffer circuit into a memory cell array of the memory device.

23. The operating method of claim 21, wherein the calculating of the amount of power consumption includes:
setting a first power amount required for applying the reset pulse and a second power amount required for applying the set pulse;
multiplying high bit information included in the bit count information by the first power amount and multiplying low bit information included in the bit count information by the second power amount; and
adding up values obtained by the multiplication and calculating the added values as the amount of power consumption.

24. The operating method of claim 21, wherein the issuing of the write command and the write command includes:
issuing the write command when the cumulative adding signal is smaller than the allocated power budget; and
suspending generation of the write command when the cumulative adding signal is equal to or greater than the allocated power budget.

* * * * *